US011807791B2

(12) United States Patent
Yamaura et al.

(10) Patent No.: US 11,807,791 B2
(45) Date of Patent: Nov. 7, 2023

(54) PHOSPHOR PLATE AND LIGHT EMITTING DEVICE USING THE SAME

(71) Applicant: DENKA COMPANY LIMITED, Tokyo (JP)

(72) Inventors: Taiyo Yamaura, Tokyo (JP); Yuki Kubota, Tokyo (JP); Kazuhiro Ito, Tokyo (JP); Hideyuki Emoto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 162 days.

(21) Appl. No.: 17/622,259

(22) PCT Filed: Jun. 22, 2020

(86) PCT No.: PCT/JP2020/024434
§ 371 (c)(1),
(2) Date: Dec. 23, 2021

(87) PCT Pub. No.: WO2020/262311
PCT Pub. Date: Dec. 30, 2020

(65) Prior Publication Data
US 2022/0251444 A1 Aug. 11, 2022

(30) Foreign Application Priority Data
Jun. 28, 2019 (JP) .................. 2019-120859

(51) Int. Cl.
*C09K 11/77* (2006.01)
*H01L 33/50* (2010.01)

(52) U.S. Cl.
CPC ........ *C09K 11/7734* (2013.01); *H01L 33/502* (2013.01)

(58) Field of Classification Search
CPC .................. C09K 11/7734; H01L 33/502
See application file for complete search history.

(56) References Cited

U.S. PATENT DOCUMENTS 8,796,915 B2    8/2014   Ooya et al.
9,608,178 B2    3/2017   Ito et al.
(Continued)

FOREIGN PATENT DOCUMENTS

CN      101379164 A    3/2009
JP    2012-009470 A    1/2012
(Continued)

OTHER PUBLICATIONS

Sep. 15, 2020 International Search Report issued in International Patent Application No. PCT/JP2020/024434.
(Continued)

*Primary Examiner* — Mary Ellen Bowman
(74) *Attorney, Agent, or Firm* — Oliff PLC

(57) ABSTRACT

A phosphor plate including a base material, and a plate-shaped composite including phosphors dispersed in the base material, in which a main component of the base material is alumina, the phosphor includes an α-type sialon phosphor, and L* value satisfies 73.5 or more and 85.0 or less, a* value satisfies 4.4 or more and 8.0 or less, and b* value satisfies 10.8 or more and 13.0 or less in L*a*b* color coordinates of the phosphor plate in a case of being measured in accordance with JIS Z 8781-4.

7 Claims, 3 Drawing Sheets

(56) References Cited

U.S. PATENT DOCUMENTS

| | | | |
|---|---|---|---|
| 10,442,987 B2 | 10/2019 | Takasone et al. | |
| 2009/0180508 A1* | 7/2009 | Makita | H01S 5/4031 |
| | | | 372/45.01 |
| 2010/0155761 A1* | 6/2010 | Ota | G02B 6/0073 |
| | | | 257/E33.061 |
| 2010/0164365 A1 | 7/2010 | Yoshino et al. | |
| 2011/0309384 A1 | 12/2011 | Ito et al. | |
| 2013/0169147 A1 | 7/2013 | Ooya et al. | |
| 2019/0062627 A1 | 2/2019 | Takasone et al. | |
| 2019/0165220 A1 | 5/2019 | Fukui et al. | |

FOREIGN PATENT DOCUMENTS

| | | | | |
|---|---|---|---|---|
| JP | 2019-045844 A | 3/2019 | | |
| JP | 2019-135543 A | 8/2019 | | |
| WO | 2012/029305 A1 | 3/2012 | | |
| WO | WO-2021079739 A1 * | 4/2021 | | C09K 11/676 |

OTHER PUBLICATIONS

Jan. 19, 2023 Office Action issued in Chinese Patent Application No. 202080045203.6.

\* cited by examiner

100

PHOSPHOR PLATE AND LIGHT EMITTING DEVICE USING THE SAME

TECHNICAL FIELD

The present invention relates to a phosphor plate and a light emitting device using the same.

BACKGROUND ART

Various developments have been made so far on phosphor plates. As a technology of this kind, for example, a technology disclosed in Patent Document 1 is known. Patent Document 1 discloses, as an example, a phosphor plate in which YAG:Ce crystal grains and alumina crystal grains are mixed (paragraph 0055 of Patent Document 1 and the like).

RELATED DOCUMENT

Patent Document

[Patent Document 1] Japanese Unexamined Patent Publication No. 2012-9470

SUMMARY OF THE INVENTION

However, as a result of the examination by the present inventors it has been found that there is room for improvement in terms of fluorescence intensity in the phosphor plate disclosed in Patent Document 1 described above.

In Patent Document 1 described above, a phosphor plate consisting of a composite including a base material including alumina as a main component and a phosphor has not been sufficiently examined.

As a result of the examination by the present inventors, it has been found that in the phosphor plate of alumina and an α-type sialon phosphor, the fluorescence intensity is decreased as a color is blackened.

As a result of further examination, it has been found that the decrease in the fluorescence intensity can be suppressed by suppressing the blackening of the phosphor plate and a degree of the blackening can be stably measured by using L*a*b* color coordinates as an index.

As a result of further diligent research based on such findings, it has been found that the fluorescence intensity of the phosphor plate can be improved by setting the L*a*b* color coordinates as an index within an appropriate range, and the present invention has been completed.

According to the present invention, provided is a phosphor plate including a base material, and a plate-shaped composite including phosphors dispersed in the base material, in which a main component of the base material is alumina, the phosphor includes an α-type sialon phosphor, and an L* value satisfies 73.5 or more and 35.0 or less, an a* value satisfies 4.4 or more and 6.0 or less, and a b* value satisfies 10.8 or more and 13.0 or less in L*a*b* color coordinates of the phosphor plate in a case of being measured in accordance with JIG Z 6781-4.

In addition, according to the present invention, provided is a light emitting device including a group III nitride semiconductor light emitting element, and the phosphor plate described above provided over one surface of the group III nitride semiconductor light emitting element.

The present invention is to provide a phosphor plate having excellent fluorescence intensity and a light emitting device using the same.

DESCRIPTION OF EMBODIMENTS

Figure 1:
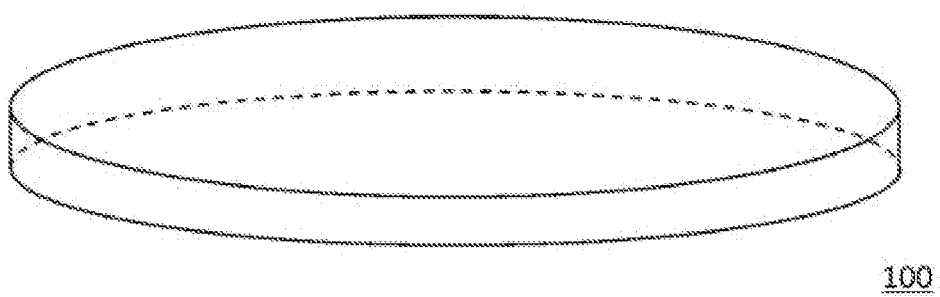
FIG. 1 is a schematic view showing an example of a configuration of a phosphor plate according to the present embodiment.

In the following, an embodiment of the present invention will be described below with reference to the drawings. Note that, in all drawings, similar components are designated by the same reference numerals, and the description thereof will not be repeated. In addition, the drawings are schematic views and do not match an actual dimensional ratio.

An outline of a phosphor plate according to the present embodiment will be described.

The phosphor plate according to the present embodiment is configured by a plate-shaped member including a base material and a plate-shaped composite including phosphors dispersed in the base material.

In the phosphor plate, a main component of the base material is alumina, and the phosphor includes an α-type sialon phosphor.

Such a phosphor plate can function as a wavelength converter that converts radiated blue light into orange light and emits the converted orange light.

In the phosphor plate according to the present embodiment, the following conditions of L*, a*, b* are satisfied in L*a*b* color coordinates of the phosphor plate in a case of being measured in accordance with JIS Z 8781-4.

L* value is 73.5 or more and 35.0 or less.
a* value is 4.4 or more and 3.0 or less.
b* value is 10.8 or more and 13.0 or less.

According to the findings of the present inventors, it has been found that a degree of blackening of the phosphor plate can be stably measured by using the L*a*b* color coordinates as an index, and the fluorescence intensity of the phosphor plate can also be improved by setting the L* value, a* value, and b* value of the L*a*b* color coordinates as the index within the range described above.

A lower limit of L* representing a brightness is 73.5 or more, preferably 74.0 or more, and more preferably 75.0 or more. On the other hand, an upper limit of L* is 85.0 or less, preferably 84.5 or less, and more preferably 84.0 or less.

A lower limit of the a* value on a + side representing the chromaticity of red is 4.4 or more, preferably 4.5 or more, and more preferably 4.6 or more. On the other hand, an upper limit of a* is 8.0 or less, preferably 7.8 or less, and more preferably 7.5 or less.

A lower limit of the b* value on a + side representing the chromaticity of yellow is 10.3 or more, preferably 10.9 or more, and more preferably 11.0 or more. On the other hand, an upper limit of b* is 13.0 or less, preferably 12.9 or less, and more preferably 12.8 or less.

The fluorescence Intensity of the phosphor plate can be increased by setting the L*, a*, and b* values to the above lower limit or more.

Although a detailed mechanism is not clear, it is considered that since the blackening of the phosphor plate including the α-type sialon phosphor and the alumina can be suppressed the decrease in the fluorescence intensity can be suppressed.

By setting the L*, a*, and b* values to the above upper limit or less, a function of the wavelength converter that converts the radiated blue light into the orange light and emits the converted orange light can be enhanced.

In the present embodiment, the L*a*b* color coordinates described above can be controlled by appropriately selecting, for example, a type or a blending amount of each component included in the phosphor plate, a manufacturing method of the phosphor plate, and the like. Among these, examples of elements for setting the L*a*b* color coordinates described above within a desired numerical range include appropriately adjusting a specific surface area of alumina powder, which is a raw material, a heating temperature in a firing step, and a content of the phosphor in the composite.

In addition, according to the present embodiment, it is preferable that the phosphor plate including the α-type sialon phosphor and the alumina be configured such that a peak wavelength of wavelength conversion light emitted from the phosphor plate is 565 nm or more and 605 nm or less in a case in which the blue light having a wavelength of 455 nm is radiated. By combining such a phosphor plate and the light emitting element that emits the blue light, it is possible to obtain a light emitting device that emits the orange light having high luminance.

In the following, the phosphor plate according to the present embodiment will be described in detail.

The phosphor (α-type sialon phosphor) and the base material (alumina) are mixed in the composite configuring the phosphor plate described above. Being mixed means a state in which the phosphors (α-type sialon phosphor) are dispersed in the alumina as the base material (matrix phase). That is, the composite may have a structure in which α-type sialon phosphor particles are dispersed between crystal grains of a (poly) crystal substance configured by the base material, and/or in the crystal grains. This α-type sialon phosphor particles may be uniformly dispersed in the base material (alumina sintered body).

The phosphor may include the α-type sialon phosphor represented by the following general formula (1).

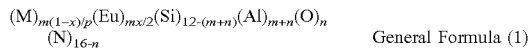

$$(M)_{m(1-x)/p}(Eu)_{mx/2}(Si)_{12-(m+n)}(Al)_{m+n}(O)_n(N)_{16-n} \quad \text{General Formula (1)}$$

In the general formula (1) described above, M represents one or more elements selected from the group consisting of Li, Mg, Ca, Y, and a lanthanide element (excluding La and Ce), p represents a valence of an M element, 0<x<0.5, 1.5≤m≤4.0, and 0≤n≤2.0. n may be 2.0 or less, 1.0 or less, or 0.8 or less, for example.

In a solid solution composition of the α-type sialon, m Si—N bonds of an α-type silicon nitride unit, cell $(Si_{12}N_{16})$ are substituted with Al—N bonds, and n Si—N bonds thereof are substituted with Al—O bonds, m/p cations (M, Eu) are solid-dissolved into a crystal lattice in order to maintain electrical neutrality, and it is represented the general formula (1) described above. In particular, in a case in which Ca is used as M, the α-type sialon is stabilized in a wide composition range, and the light having a wide wavelength from ultraviolet to blue is excited, and the phosphor showing visible emission light from yellow to orange can be obtained by substituting a part thereof with Eu which is a center of light emission.

In general, since the α-type sialon has a second crystal phase different from the α-type sialon or an amorphous phase that is inevitably present, the solid solution composition cannot be strictly defined by composition analysis and the like. As the crystal phase of the α-type sialon, an α-type sialon single phase is preferable, and as another crystal phase, β-type sialon, aluminum nitride or its polytypoid, $Ca_2Si_5N_8$, $CaAlSiN_3$, and the like may be included.

Here, in a case in which a difference in a refractive factor is too small as in a combination of a YAG phosphor and the alumina, the light is not likely to be scattered, and it is necessary to increase the phosphor content in order to prevent the transmission of the blue light.

On the other hand, the difference in the refractive factor between the α-type sialon phosphor and the alumina is moderately large, and thus it is considered that the scattering of the blue light is promoted, the transmission of the blue light can be efficiently suppressed with the low phosphor content, and bright orange light having high luminance can be emitted.

As a representative value of the refractive factor of each component, it has been known that the α-type sialon phosphor: about 2.0, the YAG phosphor: about 1.8, $Al_2O_3$: about 1.7, $SiO_2$: about 1.4.

As a manufacturing method of the α-type sialon phosphor, there is a method in which mixed powder consisting of a compound of silicon nitride, aluminum nitride, and an infiltrated solid solution element is heated and reacted in a high temperature nitrogen atmosphere.

In a heating step, a part of the constituent components forms a liquid phase, and a substance is moved to the liquid phase to generate an α-type sialon solid solution. In the α-type sialon phosphor after synthesis, a plurality of equi-axed primary particles are sintered to form massive secondary particles.

The primary particles in the present embodiment refer to the smallest particles having the same crystal orientation in the particles and capable of being present independently.

A lower limit of an average particle diameter of the α-type sialon phosphor is preferably 5 μm or more, and more preferably 10 μm or more. On the other hand, an upper limit of the average particle diameter of the α-type sialon phosphor is preferably 40 μm or less, more preferably 30 μm or less. The average particle diameter of the α-type sialon phosphor is a dimension of the secondary particles described above.

By setting the average particle diameter of the α-type sialon phosphor to 5 μm or more, it is possible to further enhance the transparency of the composite. On the other hand, by setting the average particle diameter of the α-type sialon phosphor to 40 μm or less, it is possible to suppress the occurrence of chipping in a case in which the phosphor plate is cut with a dicer or the like.

Here, the average particle diameter of the α-type sialon phosphor refers to a particle diameter $D_{50}$ of 50% of a passing amount integration (integrated passing amount ratio) from a small particle diameter side in a volume-based particle diameter distribution obtained by measurement by a laser diffraction/scattering type particle diameter distribution measurement method (LS13-320 manufactured by Beckman Coulter, Inc).

A lower limit of a content of the α-type sialon phosphor is, for example, 5 Vol % or more, preferably 10 Vol % or more, and more preferably 20 Vol % or more in terms of volume in the entire composite. As a result, it is possible to increase the fluorescence intensity in the phosphor plate having a thin layer. In addition, it is possible to improve the light conversion efficiency of the phosphor plate. On the other hand, an upper limit of the content of the α-type sialon phosphor is, for example, 60 Vol % or less, preferably 55 Vol % or less, and more preferably 50 Volt or less in terms of volume in the entire composite. As a result, it is possible to suppress the decrease in the thermal conductivity of the phosphor plate. The content of the phosphor may be within the same range as the upper limit described above and the lower limit described above of the content of the α-type sialon phosphor.

The base material included in the composite may be configured by the alumina sintered body. The alumina in the sintered body absorbs less visible light, so that it is possible to increase the fluorescence intensity of the phosphor plate. In addition, the alumina has high thermal conductivity, so that it is possible to improve the heat resistance of the phosphor plate including the alumina. Further, the alumina is also excellent in the mechanical strength, it is possible to enhance the durability of the phosphor plate.

It is desirable that the alumina in the sintered body is low in impurities from the viewpoint of the light extraction efficiency. For example, in the alumina in the sintered body, the purity of an $Al_2O_3$ compound can be, for example, 98% wt or more, preferably 99% wt or more.

The alumina in the sintered body can include one or more selected from the group consisting of α-alumina and γ-alumina. As a result, it is possible to improve the light conversion efficiency of the phosphor plate.

A lower limit of the content of the α-type sialon phosphor and the alumina is, for example, 95 Vol % or more, preferably 93 Vol % or more, and more preferably 99 Vol % or more in terms of volume in the entire composite. That is, as a result, it is possible to enhance the heat resistance or the durability, and it is also possible to realize stable light emission efficiency. On the other hand, an upper limit of the content of the α-type sialon phosphor and the alumina is not particularly limited, but may be, for example, 100 Vol % or less in terms of volume in the entire composite.

The content of the phosphor and the alumina may be within the same range as the upper limit described above and the lower limit described above of the content of the α-type sialon phosphor and the alumina.

A lower limit of the thermal conductivity of the phosphor plate is, for example, 10 W/m·K or more, preferably 15 W/m·K or more, and more preferably 20 W/m·K or more. As a result, it is possible to realize high thermal conductivity, so that it is possible to realize the phosphor plate having excellent heat resistance. On the other hand, an upper limit of the thermal conductivity of the phosphor plate described above is not particularly limited, but may be, for example, 40 W/m·K or less.

In recent years, it is known that the phosphor has a tendency to increase in the temperature due to the increase in the luminance of a light source. Even in such a case, it is possible to stably emit orange light having high luminance by using the phosphor plate having excellent, thermal conductivity.

At least a main surface of the phosphor plate, or both surfaces of the main surface and a back surface may be subjected to surface treatment. Examples of the surface treatment include grinding by using a diamond grindstone or the like, and polish such as lapping and polishing.

An example of a manufacturing process of the phosphor plate according to the present embodiment will be described.

The manufacturing method the phosphor plate according to the present embodiment can include a step (1) of mixing alumina powder and α-type sialon phosphor powder containing at least, an Eu element as a light emission center and a step (2) of heating a mixture of the alumina powder and the α-type sialon phosphor powder to fire a dense composite.

In the step (1), it is preferable that the alumina powder and the α-type sialon phosphor powder used as raw materials have high purity as much as possible, and it is preferable that the impurities of elements other than the constituent elements be 0.1% or less. Various dry and wet methods can be applied to the mixing of the raw material powder, but a method is preferable in which the α-sialon phosphor particles used as the raw material are not pulverized as much as possible and the impurities from the device are not mixed as much as possible during mixing.

An upper limit of a BET specific surface area of the alumina powder used as the raw material is, for example, 10.0 $m^2/g$ or less, preferably 9.0 $m^2/g$ or less, more preferably 8.0 $m^2/g$ or less, still more preferably 6.0 $m^2/g$. As a result, it is possible to suppress the blackening of the phosphor plate. On the other hand, a lower limit of the BET specific surface area of the alumina powder is, for example, 0.1 $m^2/g$ or more, preferably 0.5 $m^2/g$ or more, more preferably 1.0 $m^2/g$ or more, still more preferably 2.0 $m^2/g$. As a result, it is possible to increase a degree of sintering of the alumina powder and to form the dense composite.

In step (2), the mixture of the alumina powder and the α-sialon phosphor powder is fired at 1300° C. or higher and 1700° C. or lower. A heating temperature in a sintering step is more preferably 1500° C. or higher. In order to densify the composite, it is preferable that a firing temperature be high, but in a case in which the firing temperature is too high, the phosphor reacts with the alumina and the fluorescence intensity of the phosphor plate is decreased, so the range described above is preferable.

A firing method may be normal pressure sintering or pressure sintering, but in order to suppress the decrease in a characteristic of the α-sialon phosphor and obtain the dense composite, the pressure sintering, which is easier to make the composite denser than the normal pressure sintering, is preferable.

Examples of the pressure sintering method include hot press sintering, spark plasma sintering (SPS), and hot isotropic pressure (HIP) sintering. In a case of the hot press sintering or the SPS sintering, the pressure is preferably 10 MPa or more, preferably 30 MPa or more, and preferably 100 MPa or less.

A firing atmosphere is preferably a non-oxidizing inert gas, such as nitrogen or argon, or a vacuum atmosphere for the purpose of preventing the oxidation of the α-sialon.

From the above, the phosphor plate according to the present embodiment is obtained.

The surface of the plate-shaped composite in the obtained phosphor plate may be subjected to known surface treatment, such as polishing treatment, plasma treatment, or surface coating treatment, in a range in which the effects of the present invention are not impaired.

The light emitting device according to the present embodiment will be described.

The light emitting device according to the present embodiment includes a group III nitride semiconductor light emitting element (light emitting element 20), and a phosphor plate 10 described above provided over one surface of the group III nitride semiconductor light emitting element. The group III nitride semiconductor light emitting element includes, for example, an n layer, a light emitting layer, and a p layer configured by a group III nitride semiconductor, such as an AlGaN-based, GaN-based, or InAlGaN-based material. As the group III nitride semiconductor light emitting element, a blue LED that emits the blue light can be used.

The phosphor plate 10 may be disposed directly over one surface of the light emitting element 20, but can be disposed through a light transmitting member or a spacer.

As the phosphor plate 10 disposed over the light emitting element 20, a disk-shaped phosphor plate 100 (phosphor wafer) shown in FIG. 1 may be used, but an individually separated phosphor plate 100 can be used.

FIG. 1 is a schematic view showing an example of a configuration of the phosphor plate. A thickness of the phosphor plate 100 shown in FIG. 1 may be, for example, 100 μm or more and 1 mm or less. The thickness of the phosphor plate 100 can be appropriately adjusted by grinding or the like after being obtained in the manufacturing process described above.

Note that since the occurrence of chipping or cracking at the corners is suppressed as compared with a case of a rectangular shape, the disk-shaped phosphor plate 100 is excellent in the durability and the transportability.

Figure 2A:
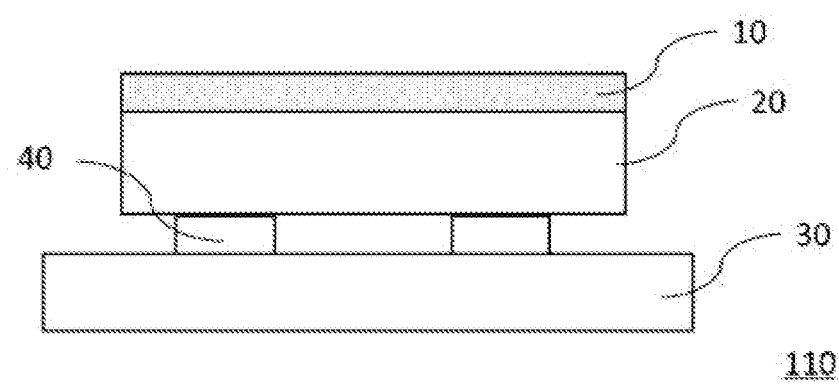
FIG. 2A is a cross-sectional view schematically showing a configuration of a flip-chip type light emitting device.

An example of a semiconductor device described above is shown in FIGS. 2A and 2B. FIG. 2A is a cross-sectional view schematically showing a configuration of a flip-chip type light emitting device 110, and FIG. 2B is a cross-sectional view schematically showing a configuration of a wire bending type light emitting device 120.

The light emitting device 110 of FIG. 2A has a substrate 30, a light emitting element 20 electrically connected to the substrate 30 through a solder 40 (die bond material), and the phosphor plate 10 provided over a light emitting surface of the light emitting element 20. The flip-chip type light emitting device 110 may have any one of a face-up type structure and a face-down type structure.

Figure 2B:
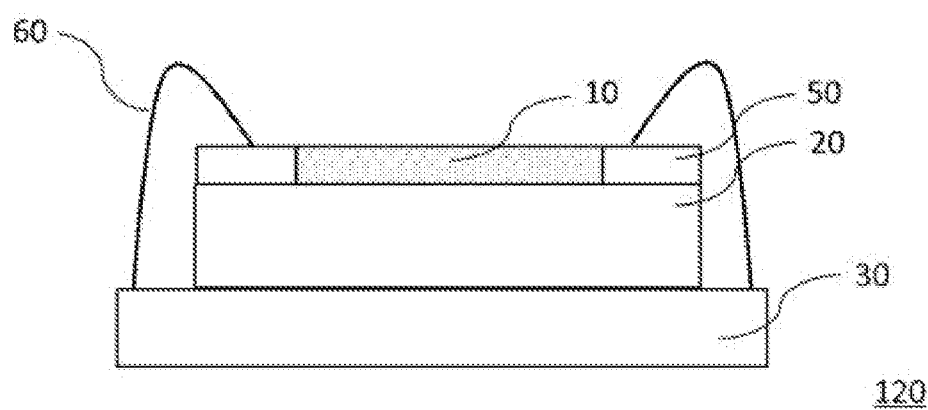
FIG. 2B is a cross-sectional view schematically showing a configuration of a wire bonding type light emitting element.

In addition, the light, emitting device 120 of FIG. 2B has the substrate 30, the light emitting element 20 electrically connected to the substrate 30 through a bonding wire 60 and an electrode 30, and the phosphor plate 10 provided over the light emitting surface of the light emitting element 20.

In FIGS. 2A and 2B, the light emitting element 20 and the phosphor plate 10 are attached by a known method, and, for example, may be adhered by a silicone-based adhesive or a heat fusion method.

In addition, the light emitting device 110 and the light emitting device 120 may be entirely sealed with a transparent sealing material.

Note that the individually separated phosphor plate 10 may be attached to the light emitting element 20 mounted on the substrate 30. A plurality of the light emitting elements 20 may be attached to the large-area phosphor plate 100, and then the light emitting elements 20 with the phosphor plate 10 may be individually separated by dicing. In addition, the large-area phosphor plate 100 may be attached to a semi-conductor wafer on which the plurality of light emitting elements 20 are formed on a surface thereof, and then the semiconductor wafer and the phosphor plate 100 may be individually separated at a time.

Although the embodiment of the present invention has been described above, the embodiment is an example of the present invention, and various configurations other than the above can be adopted. Note that the present invention is not limited to the embodiment described above, and modifications, improvements, and the like in a range in which the object of the present invention can be achieved are included in the present invention.

EXAMPLES

In the following, the present invention will be described in detail with reference to examples, but the present invention is not limited to the description of these examples.

Preparation of Phosphor Plate

Test Example 1

As a raw material of the phosphor plate of Test Example 1, alumina powder (AHP200, manufactured by Nippon Light Metal Co., Ltd., BET specific surface area: 6.0 m$^2$/g) and a Ca-α sialon phosphor (ALONBRIGHT YL-600B, manufactured by Denka Company Limited., average particle diameter $D_{50}$: 15 μm) were used.

7.85 g of the alumina powder and 2.833 g of the Ca-α sialon phosphor powder were weighed and dry-mixed with an agate mortar. The mixed raw material was disaggregated through a nylon mesh sieve having an opening of 75 μm to obtain raw material mixed powder. A blending ratio calculated from the true density of the raw materials (alumina: 3.97 g/cm$^3$ and Ca-α sialon phosphor: 3.34 g/cm$^2$) is alumina:Ca-α sialon phosphor=70:30 Vol %.

A carbon dice having an inner diameter of 30 mm in which a carbon lower punch was set was filled with about 11 g of the raw material mixed powder, a carbon upper punch was set, and the raw material powder was interposed therebetween. A carbon sheet (GRAFOIL manufactured by NEOGRAF) having a thickness of 0.127 mm was set between the raw material mixed powder and a carbon jig to prevent sticking.

A hot press jig filled with the raw material mixed powder was set in a multipurpose high temperature furnace (manufactured by Fujidempa Kogyo Co., Ltd., Hi multi 5000) with a carbon heater. An inside of the furnace was evacuated to 0.1 Pa or less, and the upper and lower punches were pressurized with a press pressure of 55 MPa while maintaining a reduced pressure state, while maintaining a pressurized state, the temperature was raised to 1600° C. at a rate of 5° C. per minute. After the temperature reaching 1600° C., heating was stopped, the temperature was slowly cooled to room temperature, and the pressure was depressurized. Then, a fired product having an outer diameter of 30 mm was collected, and an outer peripheral portion was ground by using a surface grinding machine and a cylindrical grinding machine to obtain the disk-shaped phosphor plate having a diameter of 25 mm and a thickness of 2 mm.

Note that the BET specific surface area of the alumina powder was measured based on JIS Z 8830:2013.

The bulk density of the phosphor plate of Test Example 1 was measured by a method in accordance with JIS-R1634: 1998, which was 3.729 g/cm$^3$. The theoretical density of the mixture calculated from the true density of the raw materials and the blending ratio was 3.781 g/cm$^3$, and thus the relative density of the phosphor plate of Test Example 1 was 99.9%.

As a result of polishing the phosphor plate of Test Example 1 and performing SEM observation, a state was observed in which Ca-α sialon phosphor particles were dispersed between the alumina matrix phases.

Test Example 2

The disk-shaped phosphor plate having a thickness of 2 mm was obtained in the same manner as in Test Example 1 except that the alumina powder was changed to AKP-3000 (manufactured by Sumitomo Chemical Co., Ltd., BET specific surface area: 4.5 m²/g).

Test Example 3

The disk-shaped phosphor plate having a thickness of 2 mm was obtained in the same manner as in Test Example 2 except, that the alumina powder was changed to AKP-20 (manufactured by Sumitomo Chemical Co., Ltd., BET specific surface area: 4.3 m²/g).

Test Example 4

The disk-shaped phosphor plate having a thickness of 2 mm was obtained in the same manner as in Test Example 1 except that the alumina powder was changed to AA-03 (manufactured by Sumitomo Chemical Co., Ltd., BET specific surface area: 5.2 m²/g).

Test Example 5

The disk-shaped phosphor plate having a thickness of 2 mm was obtained in the same manner as in Test Example 1 except that the alumina powder was changed to TM-DAR (manufactured by TAIMEI CHEMICALS Co., Ltd., BET specific surface area: 14.5 m²/g).

Test Example 6

The disk-shaped phosphor plate having a thickness of 2 mm was obtained in the same manner as in Test Example 1 except that the alumina powder was changed to AKP-53 (manufactured by Sumitomo Chemical Co., Ltd., BET specific surface area: 11.7 m²/g).

Color

The color of the phosphor plate obtained in each test example was measured by a device in which an integrating sphere device (ISV-469) was attached to an ultraviolet and visible spectrophotometer (V-550) manufactured by JASCO Corporation. Base correction was performed by a standard white plate (Spectralon manufactured by Labsphere). The phosphor plate was set, the measurement was performed in a wavelength range of 300 nm to 850 nm, and the color (L*, a*, b*) was calculated in accordance with JIS Z 8781-4: 2013. The results are shown in Table 1.

Based on the results of the color in Table 2, Test Examples 1 to 4 were used as Examples 1 to 4, and Test Examples 5 and 6 were used as Comparative Examples 1 and 2.

The obtained phosphor plate was evaluated based on the evaluation items described below.

Crystal Structure Analysis

As a result of measuring a diffraction pattern of the phosphor plates of Examples 1 to 4 by using an X-ray diffraction device (product name: Ultima IV, manufactured by Rigaku Corporation and its Global Subsidiaries), it was confirmed that the alumina sintered body had the crystal phase. It was found that in this crystal phase, the α-alumina and the Ca-α sialon phosphor were included as the main phase, and a small amount of the γ-alumina was mixed.

Evaluation of Optical Characteristic

The phosphor plate obtained in each of Examples and Comparative Examples was further ground by a surface grinding machine to obtain the disk-shaped phosphor plate having the plate thickness shown in Table 1, and then fluorescence intensity in accordance with the following procedure was measured.

Figure 3:
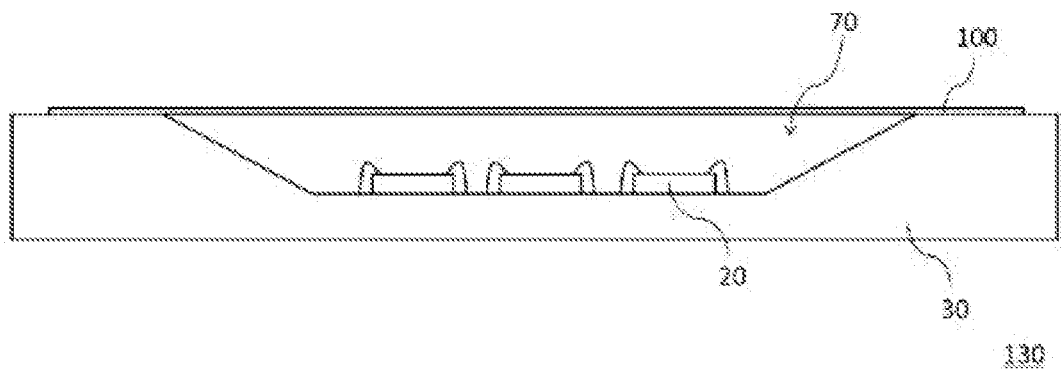
FIG. 3 is a schematic view of a device that measures a light emission spectrum of a composite.

An optical characteristic of the phosphor plate was measured by using a chip-on-board type (COB type) LED package 130. FIG. 3 is a schematic view of a device (LED package 130) that measures a light emission spectrum of the phosphor plate 100.

First, the phosphor plate 100 of each of Examples and Comparative Examples and an aluminum substrate (substrate 30) on which recess 70 was formed were prepared. A diameter φ of a bottom surface of the recess 70 was set to 13.5 mm, and a diameter φ of an opening of the recess 70 was set to 16 mm.

Next, the blue LED (light emitting element 20) was mounted as a blue light emitting light source inside the recess 70 of the substrate 30.

Thereafter, the circular phosphor plate 100 is installed above the blue LED so as to close the opening of the recess 70 of the substrate 30 to manufacture the device (chip-on-board type (COB type) LED package 130) shown in FIG. 3.

The light emission spectrum on the surface of the phosphor plate 100 when the blue LED of the manufactured LED package 130 is turned on was measured by using a total luminous flux measurement system (HalfMoon/φ1000 mm integrating sphere system, manufactured by OTSUKA ELECTRONICS CO., LTD).

In the obtained light emission spectrum, a maximum value (W/nm) of the fluorescence intensity of the orange light (orange) having a wavelength of 585 nm or more and 605 nm was obtained. Table 1 shows relative values (%) of the other Examples and Comparative Examples when the

TABLE 1

| | Phosphor | | Alumina | Plate thickness | Color | | | Standardized fluorescence |
|---|---|---|---|---|---|---|---|---|
| | Type | Concentration | Type | (mm) | L* | a* | b* | intensity |
| Example 1 | YL-600B | 30 vol % | AHP200 | 0.227 | 81.9 | 5.9 | 12.4 | 100.0% |
| Example 2 | YL-600B | 30 vol % | AKP-3000 | 0.222 | 78.7 | 5.9 | 11.7 | 104.4% |
| Example 3 | YL-600B | 30 vol % | AKP-20 | 0.221 | 78.2 | 6.2 | 11.4 | 104.8% |
| Example 4 | YL-600B | 30 vol % | AA-03 | 0.217 | 82.0 | 7.0 | 12.4 | 107.4% |
| Comparative Example 1 | YL-600B | 30 vol % | TM-DAR | 0.232 | 73.3 | 4.2 | 10.6 | 96.4% |
| Comparative Example 2 | YL-600B | 30 vol % | AKP-53 | 0.237 | 73.1 | 3.7 | 10.3 | 88.5% | maximum value of the fluorescence intensity was standardized with Example 1 as 100%.

It was shown that the phosphor plates of Examples 1 to 4 were excellent in the fluorescence intensity as compared with those of Comparative Examples 1 and 2.

This application claims priority based on Japanese Patent Application No. 2019-120859 filed on Jun. 26, 2019, the entire disclosure of which is incorporated herein by reference.

REFERENCE SIGNS LIST

10: phosphor plate
20: light emitting element
30: substrate
40: solder
50: electrode
60: bonding wire
70: recess
100: phosphor plate
100: light emitting device
120: light emitting device
130: LED package

The invention claimed is:

1. A phosphor plate comprising:
a base material; and
a plate-shaped composite including phosphors dispersed in the base material,
wherein a main component of the base material is alumina,
the phosphor includes an α-type sialon phosphor, and
L* value satisfies 73.5 or more and 85.0 or less, a* value satisfies 4.4 or more and 8.0 or less, and b* value satisfies 10.8 or more and 13.0 or less in L*a*b* color coordinates of the phosphor plate in a case of being measured in accordance with JIS Z 8781-4.

2. The phosphor plate according to claim 1,
wherein a content of the phosphor is 5 Vol % or more and 60 Vol % or less in an entire of the composite.

3. The phosphor plate according to claim 1, wherein a total value of a content of the α-type sialon phosphor and a content of the alumina is 95 Vol % or more and 100 Vol % or less in an entire of the composite.

4. The phosphor plate according to claim 1,
wherein a thermal conductivity of the phosphor plate is 10 W/m·K or more and 40 W/m·K or less.

5. The phosphor plate according to claim 1,
wherein the α-type sialon phosphor includes an α-type sialon phosphor represented by the following general formula (1),

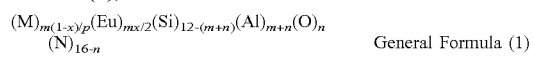
$$(M)_{m(1-x)/p}(Eu)_{mx/2}(Si)_{12-(m+n)}(Al)_{m+n}(O)_n(N)_{16-n} \quad \text{General Formula (1)}$$

(in the general formula (1), M represents one or more elements selected from the group consisting of Li, Mg, Ca, Y, and a lanthanide element (excluding La and Ce), p represents a valence of an M element, $0<x<0.5$, $1.5 \leq m \leq 4.0$, and $0 \leq n \leq 2.0$).

6. The phosphor plate according to claim 1,
wherein the phosphor plate is used as a wavelength converter that converts radiated blue light into orange light and emits the converted orange light.

7. A light emitting device comprising:
a group III nitride semiconductor light emitting element; and
the phosphor plate according to claim 1 provided over one surface of the group III nitride semiconductor light emitting element.

* * * * *